US012588144B2

(12) United States Patent
Schultheis

(10) Patent No.: US 12,588,144 B2
(45) Date of Patent: Mar. 24, 2026

(54) COMPONENT FOR SURFACE SOLDERING INSTALLATION ON A CIRCUIT BOARD, ASSOCIATED USE AND ASSEMBLY

(71) Applicant: Preh GmbH, Bad Neustadt a.d. Saale (DE)

(72) Inventor: Thilo Schultheis, Bad Neustadt a.d. Saale (DE)

(73) Assignee: Preh GmbH, Bad Neustadt a.d. Saale (DE)

( * ) Notice: Subject to any disclaimer, the term of this patent is extended or adjusted under 35 U.S.C. 154(b) by 364 days.

(21) Appl. No.: 18/308,830

(22) Filed: Apr. 28, 2023

(65) Prior Publication Data

US 2023/0354519 A1 Nov. 2, 2023

(30) Foreign Application Priority Data

Apr. 29, 2022 (DE) .......................... 102022110497.4

(51) Int. Cl.
| | |
|---|---|
| *H05K 1/11* | (2006.01) |
| *H01H 13/26* | (2006.01) |
| *H01R 12/57* | (2011.01) |
| *H05K 1/02* | (2006.01) |
| *H05K 3/34* | (2006.01) |
| *H05K 3/341* | (2026.01) |

(52) U.S. Cl.
CPC .............. *H05K 1/11* (2013.01); *H01H 13/26* (2013.01); *H01R 12/57* (2013.01); *H05K 1/0293* (2013.01); *H05K 3/341* (2013.01); *H01H 2203/038* (2013.01); *H05K 2201/10545* (2013.01)

(58) Field of Classification Search
CPC .. H01R 13/2407; H01R 12/57; H05K 1/0293;

H05K 1/11; H05K 3/341; H05K 2201/10545; H05K 1/02; H05K 3/34; H01H 13/26; H01H 2203/038
USPC ........................................................ 200/402
See application file for complete search history.

(56) References Cited

U.S. PATENT DOCUMENTS

2021/0232023 A1* 7/2021 Sugiura .................. H04N 23/57

FOREIGN PATENT DOCUMENTS

| | | |
|---|---|---|
| DE | 19600966 A1 | 7/1997 |
| DE | 102019217186 A1 | 5/2021 |
| WO | 2016204247 A1 | 12/2016 |

OTHER PUBLICATIONS

German Office Action for DE102022110497.4 dated Feb. 3, 2022. German Patent and Trademark Office, Munich, Germany.

* cited by examiner

*Primary Examiner* — Anthony R Jimenez
(74) *Attorney, Agent, or Firm* — M&B IP Analysts, LLC

(57) ABSTRACT

The present disclosure relates to a component for the surface soldering installation on a circuit board, comprising: a basic body forming at least one locating surface provided for contact with a surface of the circuit board, or several locating points spanning a plane; two elastic brackets, which are formed on opposing sides of the basic body and respectively form one soldering surface for a solder connection with a positioning surface of the circuit board, wherein each of the two brackets has, in sequential arrangement over its course from the basic body to the soldering surface, a strip-shaped, flat, first portion and a strip-shaped, flat, second portion, wherein the main surfaces of the first portion are arranged at an angle to the main surfaces of the second portion; a use and an associated assembly.

16 Claims, 2 Drawing Sheets

COMPONENT FOR SURFACE SOLDERING INSTALLATION ON A CIRCUIT BOARD, ASSOCIATED USE AND ASSEMBLY

The present disclosure relates to a component for surface soldering installation on a circuit board, an associated use and an assembly. Fixing components, particularly those with an SMD design (SMD=Surface Mounted Devices), on a circuit board by means of a solder connection is known. In SMD mounting, components, such as electronic or electromechanical components, are mounted on the surface of circuit boards, also referred to as boards, by means of component placement machines. In contrast to conventional THT mounting (THT=Through hole Technology), components are directly mounted on the surface of the circuit board instead of being soldered by means of wire terminals. Here, SMD mounting today is the dominant technology in component mounting on circuit boards. Mounting on the circuit board in this case not only includes the placement of the components on the circuit board, but the following working steps: application of soldering paste, which consists of tin particles and flux, by means of paste printing; mounting the components on the circuit board in the soldering paste; soldering the circuit board by means of the reflow method.

While electronic components are generally not subjected to mechanical loads, or small loads at most, during the further assembly and also during the use as intended, there are other, predominantly electromechanical, components, such as the plug-in connectors for establishing an electrical connection which, primarily during assembly, may be subjected to high mechanical loads, but also such components that are mechanically stressed primarily while being used as intended, such as snap domes used as a switching member for altering a switching state and/or for generating snap haptics when actuating an actuating element. Snap domes are fixed on a circuit board by means of an adhesive film, for instance. However, such an approach is not suitable in the case of multi-side SMD mounting on the circuit board because the film would be damaged in the reflow process. A fixation of electromechanical components to the circuit board by means of a solder connection, particularly by several solder connections, is disadvantageous in that the solder connection, in particular, is exposed to particularly high stresses when subjected to mechanical loads, which may result in total failure.

There is therefore a demand for a component for surface soldering installation in which the durability of the solder connections is ensured in an improved manner despite high mechanical loads on the component. This object is achieved by a component according to claim 1 and by an assembly according to claim 11. A correspondingly advantageous use is the subject matter of the use claim. Advantageous embodiments are in each case the subject matter of the dependent claims. It must be remarked that the features cited individually in the patent claims can be combined in any technologically meaningful manner and depict other embodiments of the present disclosure. The description, in particular in connection with the figures, additionally characterizes and specifies the disclosed embodiments.

The present disclosure relates to a component, particularly an electromechanical component, for surface soldering installation on a circuit board, also referred to as a board. This component has a basic body forming at least one locating surface provided for contact with a surface of the circuit board, or several locating points, which are provided at outer locations of the basic body, for example, and span a plane. The component according to the present disclosure further comprises two elastically yielding brackets, which are formed on opposing sides of the basic body and respectively form one soldering surface, which is preferably formed at a portion at the end of the respective bracket, for a solder connection with an associated positioning surface. The soldering surfaces are arranged in the plane spanned by the locating surface or the several locating points.

According to the present disclosure, each of the two brackets has, in sequential arrangement over its course from the basic body to the soldering surface, a strip-shaped, flat, first portion and a strip-shaped, flat, second portion, wherein the main surfaces of the first portion and the main surfaces of the second portion are arranged at an angle to each other, i.e. they are neither situated in the same plane nor in parallel planes. For example, the planes spanned by the main surfaces of the first portion 4a include an angle in the range from 70° to 110° with the main surfaces of the second portion 4b. The main surfaces are understood to be those sides of the first portion or of the second portion that have the largest surface area compared to the remaining sides of the respective portion. The main surfaces of one portion are substantially parallel to each other, for instance. Because the first portion and the second portion are each formed to be strip-shaped and flat, they have the largest elastic compliance in the direction perpendicular to the respective main surface.

Due to the feature of the present disclosure, namely of the main surfaces of the first portion and the main surfaces of the second portion differing in their relative orientation in space, each bracket has an elastic degree of freedom in two different directions, which improves the mechanical load on the solder connection between the component-side soldering surface and the circuit board-side positioning surface in the case of mechanical stress on the basic body. The solder connections being provided several times between the component and the circuit board enables a multi-side mounting on the circuit board with the SMD technique, particularly including soldering the circuit board with the reflow method.

Preferably, the component is an electromechanical component. More preferably, the basic body is configured, if arranged between an actuating element and the circuit board, to act in a resetting manner on the actuating element when the actuating element is actuated and, optionally, so as to produce an electric switching contact at least in cooperation with the circuit board. Because of the arrangement of the basic body in the force path of the actuating force acting on the actuating element, but also due to the mechanically resetting action and the elastic deformation of the basic body resulting therefrom, the mechanical requirements with regard to the solder connections between the component and the circuit board are particularly high and also include forces acting in a direction parallel to the circuit board surface, such as shear forces. Due to the fact that the brackets permit an elastic compensatory movement of the basic body in several directions, breakage of the solder connections between the component and the circuit board can be effectively avoided.

Preferably, the basic body has a switching dome, wherein the switching dome can be deformed from a stable state into an unstable state while providing snap haptics. Snap haptics are understood to be a force-path curve with respect to the resetting force, in which the force-path curve reaches a local maximum prior to reaching a pressed unstable final position. Such a basic body provided with a switching dome is usually referred to as a "snap dome".

Preferably, the basic body and the brackets are formed integrally. More preferably, they are formed as a bent stamped part from a metal sheet. Most preferably, the component is formed completely from a bent and optionally embossed metal sheet, such as a spring steel sheet.

According to a preferred embodiment, a first, longest extending direction of the first portion is parallel to a second, longest extending direction of the second portion for each of the two brackets.

Preferably, the brackets are each rooted in the basic body, offset in opposite directions relative to a geometric center of the respective side.

Preferably, the main surfaces of at least one portion from among the first portion and the second portion are parallel to the locating surface or to the plane spanned by the locating points, and thus, in the state of being fixed to the circuit board, parallel to the surface of the circuit board. More preferably, the first portion is parallel to the locating surface or to the plane spanned by the locating points.

Preferably, the main surfaces of the first portion are oriented substantially orthogonally to the main surfaces of the second portion.

Preferably, the two brackets are each configured in a meandering shape starting from the basic body to the associated soldering surface. For example, the first portion and the second portion are connected by a third portion, which is curved several times.

The disclosed embodiments further relate to the use of the component according to any one of the preceding claims in the surface soldering installation on a circuit board, preferably when mounting on the circuit board using the SMD technique, more preferably in multi-side mounting on the circuit board using the SMD technique.

The disclosed embodiments further relate to an assembly comprised of a circuit board and a component in one of the above-described embodiments, wherein the basic body merely rests against the circuit board, and only the soldering surface of each bracket is fixed to the associated positioning surface of the circuit board by a solder connection. In combination with the inventive design of the component, namely that the main surfaces of the first portion and the main surfaces of the second portion differ in their relative orientation in space, each bracket has an elastic degree of freedom in two different directions, which improves the mechanical load on the solder connection between the component-side soldering surface and the circuit board-side positioning surface in the case of mechanical stress on the basic body.

Preferably, the assembly according to the disclosed embodiments further comprises an actuating element, wherein the basic body of the component is arranged between the actuating element and the circuit board, and acts in a resetting manner on the actuating element when the actuating element is actuated and, optionally, produces an electric switching contact at least in cooperation with the circuit board.

Because of the arrangement of the basic body in the force path of the actuating force acting on the actuating element, but also due to the mechanically resetting action and the elastic deformation of the basic body resulting therefrom, the mechanical requirements with regard to the solder connections between the component and the circuit board are particularly high and also include forces acting in a direction parallel to the circuit board surface, such as shear forces. Due to the fact that the brackets permit an elastic compensatory movement of the basic body in several directions, breakage of the solder connections between the component and the circuit board can be effectively avoided.

The various disclosed embodiments are explained further with reference to the following Figures. The Figures are to be understood only as examples and merely represent preferred variants of the embodiments. In the Figures.

Figure 1:
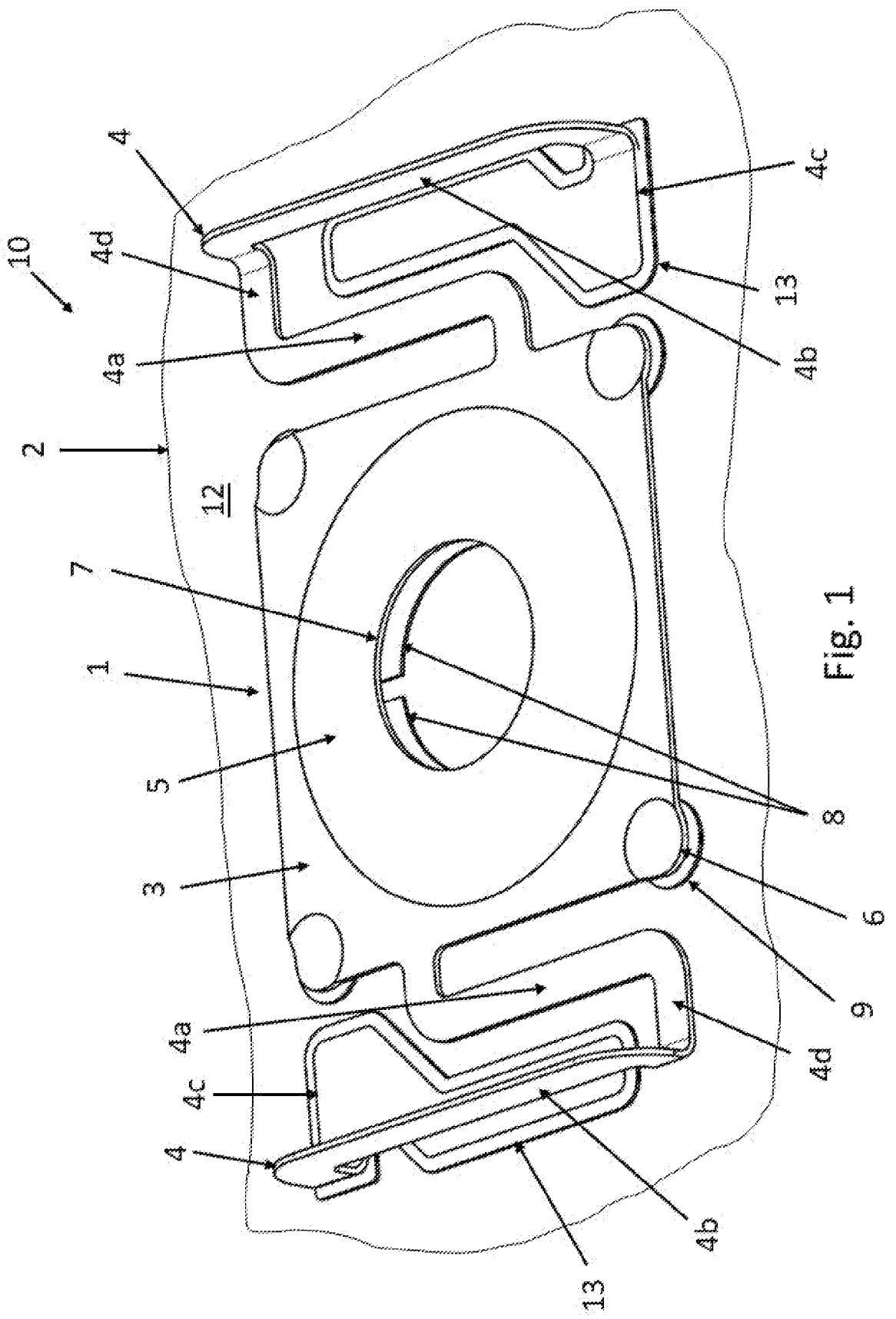
FIG. 1 shows a perspective of an embodiment of the assembly 10 according to an embodiment.
Figure 2:
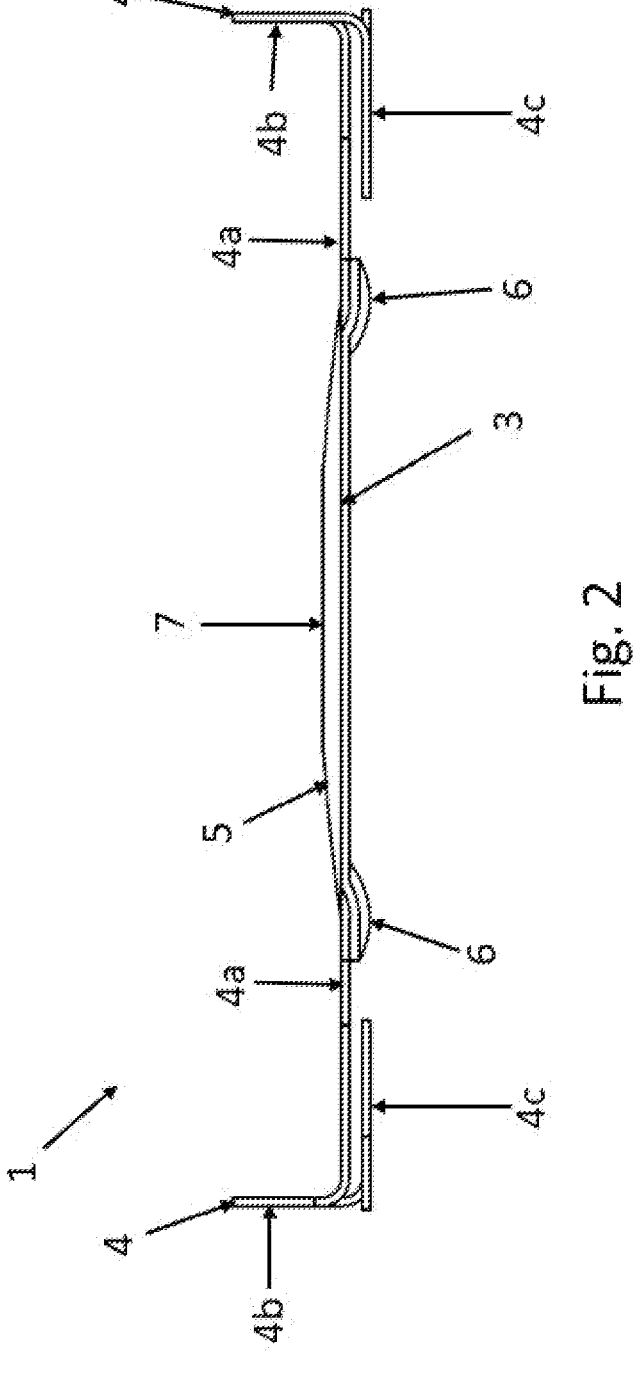
FIG. 2 shows a side view of the component 1 according to an embodiment, which is shown in FIG. 1 and which belongs to the assembly 10 of the embodiment from FIG. 1.

FIG. 1 shows an embodiment of the assembly 10 according to an embodiment. It has a circuit board 2 and a component 1, which is fixed to a surface 12 of the circuit board 2 exclusively by two solder connections. The depicted component 1 is an electromechanical component suitable for surface soldering installation on the circuit board 12. The solder connection is in each case provided between the soldering surfaces 4c of the component 1 and associated copper- or gold-coated positioning surfaces 13 of the circuit board 2. The basic body 3 associated with the component 1 merely rests against the circuit board 2 via several contact points 6 on the surface 12 of the circuit board 2, which are arranged in a common plane, wherein the contact points 6 are defined by spherical protrusions projecting in the direction of the circuit board 2, which are formed by embossing at the outer corners of the substantially square-shaped basic body 3. An actuating element, which is optionally associated with the assembly according to an embodiment and which acts on the component 1, is not depicted. The component 1 further comprises two elastically yielding brackets 4, which are formed on opposing sides of the basic body 3 and respectively form one soldering surface 4c, which is preferably formed at a portion at the end of the respective bracket 4, for a solder connection with the associated positioning surface 13 of the circuit board 2. The soldering surfaces 4c are arranged in the plane spanned by the several locating points 6. The basic body 3 and the brackets 4 are formed integrally and as a bent stamped part from a metal sheet.

In this case, each of the two brackets 4 has, in sequential arrangement over its course from the basic body 3 to the respective soldering surface 4c, a strip-shaped, flat, first portion 4a and a strip-shaped, flat, second portion 4b, wherein the main surfaces of the first portion 4a and the main surfaces of the second portion 4b are arranged at an angle to each other, i.e. they are neither situated in the same plane nor in parallel planes. For example, the planes spanned by the main surfaces of the first portion 4a include an angle in the range from 70° to 110° with the main surfaces of the second portion 4b. The main surfaces are understood to be those sides of the first portion 4a or of the second portion 4b that have the largest surface area compared to the remaining sides of the respective portion. The main surfaces of the first portion 4a and of the second portion 4b are substantially parallel to each other and substantially planar in the non-loaded state. Because the first portion 4a and the second portion 4b are each formed to be strip-shaped and flat, they have the largest elastic compliance in the direction perpendicular to the respective main surface.

Due to the feature of the disclosed embodiments, namely of the main surfaces of the first portion 4a and the main surfaces of the second portion 4b differing in their relative orientation in space, each bracket 4 has an elastic degree of freedom in two different directions, which improves the mechanical load on the solder connection between the component-side soldering surface 4c and the circuit board-side positioning surface 13 in the case of mechanical stress on the basic body 3. For example, the planes spanned by the main surfaces of the first portion 4a include an angle in the range from 70° to 110° with the main surfaces of the second portion 4b. In the illustrated embodiment, the main surfaces of the first portion 4a are oriented substantially orthogonally to the main surfaces of the second portion 4b, while the main surfaces of the first portion 4a are parallel to the plane spanned by the locating points 6, and thus, in the state of being fixed to the circuit board, parallel to the surface 12 of the circuit board 2. In the illustrated embodiment, the two brackets 4 are each configured in a meandering shape starting from the basic body 3 to the associated soldering surface 4c, because the first portion 4a and the second portion 4b are connected by a third portion 4d, which is curved several times. A first, longest extending direction of the first portion 4a is parallel to a second, longest extending direction of the second portion 4b for each of the two brackets 4. In this case, the brackets 4 are each rooted in the basic body 3, offset in opposite directions relative to a geometric center of the respective side.

In the illustrated embodiment, the basic body 3 is configured, if arranged between an actuating element and the circuit board 2, to act in a resetting manner on the actuating element when the actuating element is actuated, and so as to produce, in cooperation with the circuit board 2, an electric switching contact between the contact surfaces 8 of the circuit board 2. Thus, the basic body 3 has a switching dome 5, wherein the switching dome 5 can be deformed from a stable state into an unstable state while providing snap haptics. A through-hole 7 for light of a light source, which is provided on the circuit board 2 and which is not shown, is provided in the center of the switching dome 5. Snap haptics are understood to be a force-path curve with respect to the resetting force, in which the force-path curve reaches a local maximum prior to reaching a pressed unstable final position of the switching dome 5. Such a basic body 3 provided with a switching dome 5 is usually referred to as a "snap dome".

Because of the arrangement of the basic body 3 in the force path of the actuating force acting on the actuating element, but also due to the mechanically resetting action and the elastic deformation of the basic body 3, particularly of the switching dome 5, resulting therefrom, the mechanical requirements with regard to the solder connections between the component 1 and the circuit board 2 are particularly high and also include forces acting in a direction parallel to the circuit board surface 12, such as shear forces. Due to the fact that the brackets 4 permit an elastic compensatory movement of the basic body 3 in several directions, breakage of the solder connections between the component 1 and the circuit board 2 can be effectively avoided.

What is claimed is:

1. A component for a surface soldering installation on a circuit board, comprising: a basic body forming at least one locating surface provided for contact with a surface of the circuit board, or several locating points spanning a plane; two elastic brackets, which are formed on opposing sides of the basic body and respectively form a soldering surface for a solder connection with a positioning surface of the circuit board, wherein each of the two elastic brackets has, in sequential arrangement over its course from the basic body to the soldering surface, a strip-shaped, flat, first portion and a strip-shaped, flat, second portion, wherein main surfaces of the first portion are arranged at an angle to main surfaces of the second portion.

2. The component according to claim 1, wherein the two elastic brackets are each rooted in the basic body, offset in opposite directions relative to a geometric center of the respective side.

3. The component according to claim 1, wherein the main surfaces of at least one portion from among the first portion and the second portion are parallel to the at least one locating surface or to the plane spanned by the locating points.

4. The component according to claim 1, wherein the main surfaces of the first portion are oriented substantially orthogonally to the main surfaces of the second portion.

5. The component according to claim 1, wherein the two elastic brackets are each configured in a meandering shape starting from the basic body to the soldering surface.

6. The component according to claim 1, wherein the component is used in the surface soldering installation on the circuit board.

7. The component according to claim 1, wherein the basic body and the elastic brackets are formed integrally as a bent stamped part from a metal sheet.

8. The component according to claim 1, wherein each of the two elastic brackets has an elastic degree of freedom in two different directions.

9. The component according to claim 1, wherein the basic body and the elastic brackets are formed integrally.

10. The component according to claim 9, wherein, for each of the two elastic brackets, a first, longest extending direction of the first portion is parallel to a second, longest extending direction of the second portion.

11. An assembly, comprising: a circuit board and a component according to claim 1, wherein the basic body of the component rests unsoldered against the circuit board, and only the soldering surface of each bracket is fixed to an associated positioning surface of the circuit board by a solder connection.

12. The assembly according to claim 11, further comprising an actuating element, wherein the basic body of the component is arranged between the actuating element and the circuit board, and acts in a resetting manner on the actuating element when the actuating element is actuated.

13. The assembly according to claim 12, wherein the basic body of the component produces an electric switching contact at least in cooperation with the circuit board.

14. The component according to claim 1, wherein the basic body is configured to act in a resetting manner on an actuating element when the actuating element is actuated, wherein the basic body is arranged between the actuating element and the circuit board.

15. The component according to claim 14, wherein the basic body has a switching dome, and the switching dome can be deformed from a stable state into an unstable state while providing snap haptics.

16. The component according to claim 14, wherein the basic body is configured to produce an electric switching contact at least in cooperation with the circuit board.

* * * * *